(12) United States Patent
Detlefsen et al.

(10) Patent No.: US 9,178,490 B2
(45) Date of Patent: Nov. 3, 2015

(54) DMS FILTER HAVING IMPROVED SIGNAL SUPPRESSION IN THE STOP BAND

(75) Inventors: Andreas Detlefsen, Eichenau (DE); Ravi Challa, Rancho Santa Margarita, CA (US)

(73) Assignee: EPCOS AG, Munich (DE)

( * ) Notice: Subject to any disclaimer, the term of this patent is extended or adjusted under 35 U.S.C. 154(b) by 413 days.

(21) Appl. No.: 13/521,403

(22) PCT Filed: Jan. 18, 2011

(86) PCT No.: PCT/EP2011/050601
§ 371 (c)(1),
(2), (4) Date: Sep. 13, 2012

(87) PCT Pub. No.: WO2011/089110
PCT Pub. Date: Jul. 28, 2011

(65) Prior Publication Data
US 2013/0141188 A1    Jun. 6, 2013

(30) Foreign Application Priority Data
Jan. 21, 2010   (DE) .......................... 10 2010 005 306

(51) Int. Cl.
*H03H 9/64* (2006.01)
*H03H 9/00* (2006.01)
*H03H 9/02* (2006.01)

(52) U.S. Cl.
CPC .............. *H03H 9/64* (2013.01); *H03H 9/0038* (2013.01); *H03H 9/0042* (2013.01); *H03H 9/02874* (2013.01); *H03H 9/02952* (2013.01)

(58) Field of Classification Search
CPC ......... H03H 9/64; H03H 9/6403; H03H 9/72; H03H 9/0038; H03H 9/0042; H03H 9/02874; H03H 9/02952
USPC .................................................. 333/195, 194
See application file for complete search history.

(56) References Cited

U.S. PATENT DOCUMENTS

| 5,966,060 A | 10/1999 | Ikada |
| 2006/0044079 A1 | 3/2006 | Nishizawa et al. |
| 2006/0044081 A1 | 3/2006 | Tanaka et al. |
| 2006/0267708 A1 | 11/2006 | Matsuda et al. |
| 2007/0290770 A1 | 12/2007 | Otsuka et al. |
| 2008/0284540 A1 | 11/2008 | Nishihara et al. |
| 2009/0160574 A1 | 6/2009 | Yamane et al. |
| 2009/0289745 A1 | 11/2009 | Bauer et al. |
| 2010/0026417 A1* | 2/2010 | Kubat et al. .................. 333/133 |
| 2011/0006855 A1 | 1/2011 | Fujiwara et al. |

FOREIGN PATENT DOCUMENTS

| DE | 10 2006 057 340 A1 | 6/2008 |
| DE | 11 2007 002 105 T5 | 10/2009 |
| JP | 1212015 A | 8/1989 |
| JP | 1093381 A | 4/1998 |
| JP | 2001308672 A | 11/2001 |

(Continued)

*Primary Examiner* — Stephen E Jones
*Assistant Examiner* — Scott S Outten
(74) *Attorney, Agent, or Firm* — Slater & Matsil, L.L.P.

(57) ABSTRACT

A DMS filter has improved signal suppression in fly-back. At least two transformers of a first type are connected in parallel between a common node of the signal path and a ground connection/reference potential. A concentrated element is connected in the signal path of said transformers of the first type, so that the voltages present at the first transformers are different from each other.

15 Claims, 7 Drawing Sheets

(56) References Cited

FOREIGN PATENT DOCUMENTS

| | | | |
|---|---|---|---|
| JP | 2004253937 A | 9/2004 |
| JP | 2004274574 A | 9/2004 |
| JP | 2005102328 A | 4/2005 |
| JP | 2006333012 A | 12/2006 |
| JP | 2007181195 A | 7/2007 |
| JP | 2008271230 A | 11/2008 |
| WO | WO 2009/113274 A1 | 9/2009 |

* cited by examiner

A    B

A    B    C

D

EK1 ≠ EK2

DMS FILTER HAVING IMPROVED SIGNAL SUPPRESSION IN THE STOP BAND

This patent application is a national phase filing under section 371 of PCT/EP2011/050601, filed Jan. 18, 2011, which claims the priority of German patent application 10 2010 005 306.6, filed Jan. 21, 2010, each of which is incorporated herein by reference in its entirety.

BACKGROUND

SAW (Surface Acoustic Wave) filters of the DMS (Dual Mode SAW filter) type are preferably used as RF filters when the intention is either to change from asymmetrical to symmetrical signal routing or to achieve small filter dimensions. DMS filters comprise at least two resonators which are arranged in the same acoustic track, acoustically couple to one another and are preferably alternately connected to the input and output sides of the RF filter. The number of input and output transducers laterally arranged beside one another in the longitudinal direction determines the electrical performance of the filter substantially via the respective transducer impedances and the resonances occurring between the individual transducers.

In order to improve the selectivity of DMS filters, it is known practice to connect the filters to individual resonators or to one or more basic elements of a ladder-type structure. In this case, a so-called basic element respectively comprises at least one acoustic resonator arranged in a series path and an acoustic resonator connected to ground in parallel therewith in a shunt branch.

On account of their symmetrical structure, DMS filters are also suitable for symmetrizing an asymmetrical or single-ended signal or converting it into a balanced signal. However, it is also possible to operate a DMS filter in an asymmetrical-asymmetrical or symmetrical-symmetrical manner.

SUMMARY OF THE INVENTION

In one aspect, the present invention specifies a filter with low insertion loss and with simultaneously high selectivity, in particular in the other band and in the so-called fly-back. Another object is to further improve known DMS filters with respect to these two optimization criteria.

If the following text refers to a transducer, a resonator or another element of the filter or an item, this does not preclude a larger number of this element also being able to be present. The same also applies to other numerical values if not respectively based on precisely this number.

If an arbitrary element which occurs several times is provided with numbering, for example first element or second element, this numbering is used solely to distinguish the elements. In this case, a higher digit does not automatically imply that a corresponding number of these elements must be present or that a hierarchy of these different elements is intended to be expressed.

The proposed DMS filter has a basic structure known per se and therefore has at least two transducers of a first type and at least one transducer of a second type, which may each be input or output transducers of the filter. The connections of the two transducers of the first type are connected to a common node on one side via two different signal paths. On the other side, the transducers are connected to a reference potential, for example ground. Whereas, in the known case, the signal paths are identical and identical signal voltages are applied to the transducers of the first type, an additional concentrated element is now connected into one of the signal paths or between the transducer and the reference potential. Different voltages are therefore applied to the transducers of the first type.

However, it is also possible to connect a further concentrated element into the second signal path. If the first and second concentrated elements are different, this likewise results in different voltages at the transducers of the first type.

In one preferred embodiment, the concentrated element is connected in series between the transducer and the common node or between the transducer and the reference potential and is in the form of a variable capacitance.

Another possible way of connecting the concentrated element is to arrange the latter at the respective location but in a shunt branch with respect to the respective signal path, which shunt branch is connected to the reference potential.

The invention specifies a DMS filter which is designed to be asymmetrical with respect to known DMS filters on one side, which may be the input or output side, as a result of an additional concentrated element, in particular a series capacitance (=variable capacitance connected in series). In this case, it is surprisingly found that the selectivity level is considerably improved with this measure in comparison with a comparable DMS filter without this variable capacitance. The selectivity level is improved by approximately 10 dB, in particular in fly-back, that is to say in the range from twice the resonant frequency to beyond three times the resonant frequency. The selectivity is improved by 5 dB, for example, in the other band. The passband remains virtually unchanged in this case.

This advantageous effect can be explained by the fact that the capacitive crosstalk between different transducers of the first and second types is reduced or compensated for using this additional concentrated element. When a (variable) capacitance is used as the concentrated element, the voltage, for example, at the transducer connected in this path is reduced, thus reducing the capacitive crosstalk with respect to the adjacent transducer of the second type. In this case, the variable capacitance is used as a voltage divider for the transducer connected in series with the variable capacitance. A reduced capacitive crosstalk results in undesirable signals being better attenuated outside the passband and the selectivity level being improved in the broadband.

Cross-coupling can be changed and, in particular, reduced by the different power coupling into the two transducers of the first type.

In another refinement of the invention, a series resonator is connected in series with all transducers of the first or second type. This series connection can be effected in groups, that is to say for a plurality of or all transducers of one type with the aid of a common series resonator, or individually for each transducer of one type using a respective series resonator.

In one preferred embodiment which also saves chip surface, a single series resonator is connected between the signal connection and a node to which all transducers of one type are connected. This series resonator further improves the right-hand edge of the transfer function of the filter.

In another preferred embodiment, the variable capacitance is in the form of a variable resonator and, in particular, in the form of an acoustic resonator. This has the advantage that the variable resonator operating with acoustic waves can be produced in a simple manner together with the metallization of the input and output transducers and is less capacitive in the vicinity of the resonant frequency. In one embodiment, the variable capacitance is in the form of an acoustic single-port resonator.

In addition, the capacitance $C_0$ of a variable resonator can be varied without thereby changing the resonant frequency of the variable resonator. The resonant frequency of the variable resonator is preferably in the passband of the DMS filter, while its antiresonance is in the region of the right-hand edge of the passband. Although the capacitance value of a variable capacitance in the form of a pure capacitance can be changed, the matching and transmission behavior in the region of the resonant frequency simultaneously change to a greater extent.

In one embodiment, the DMS filter has at least three transducers of the first type. It is advantageous if the concentrated element is then connected in the signal path which comprises a middle transducer of the at least three transducers of the first type. A maximum effect of improved selectivity is achieved with only one concentrated element if the middle transducer is connected to the variable capacitance. This results in a particularly space-saving embodiment.

It is naturally also possible to connect additional concentrated elements and, in particular, variable capacitances between the common node and a further transducer of the first type, but another transducer of the first type is always connected to the common node in a different manner. In particular, the signal path containing this other transducer is connected to another concentrated element, the first and second concentrated elements being different. The same applies to the situation in which the concentrated element is connected to the respective signal path at a location between the respective transducer and the reference potential.

It is possible to connect the common node to an asymmetrical signal connection or to a connection of a symmetrical port or to one of two connections of a symmetrical port which are symmetrical to one another.

If the common node is connected to a symmetrical signal connection, a second common node which is connected to the second signal connection of the symmetrical port is provided for reasons of symmetry. The further connection of the second common node then corresponds in principle, but preferably exactly, to that of the first common node. That is to say that one of the transducers of the first type which are connected to the second common node is also directly connected to the second common node, while a second concentrated element, in particular, a second variable capacitance, is connected between the second common node and another one of the further transducers of the first type. This measure is used to compensate for the symmetry deviation associated with the concentrated element by virtue of the second signal path connected to the other connection of the symmetrical port, together with the transducer arranged in said path, being designed to be accordingly asymmetrical and the entire DMS filter thereby being symmetrized again.

In one exemplary embodiment, the transducers of the first type are input transducers, with the result that the common node is connected to the signal connection of the input. The common series resonator can then be arranged between the signal connection of the input and the common node. If the signal connection of the input is a symmetrical signal connection, a second common series resonator may be arranged between the second symmetrical signal connection at the input and the second common node. However, it is also possible, in the symmetrical situation, to connect a respective series resonator between the common node and one of the input transducers. The concentrated element in the signal path of the at least one transducer of the first type is then connected in series with this series resonator.

In another embodiment, the transducers of the first type are in the form of output transducers. The common node is accordingly connected to a signal connection of the output. However, the common series resonator may also be arranged between the signal connection of the input and the input transducers in this embodiment.

It has been found that the extent to which the filter selectivity is improved depends on the capacitance value of the variable capacitance or generally on the "value" of the concentrated element.

In one advantageous embodiment of the invention, the capacitance value of the variable capacitance is therefore varied until optimum far-end selectivity is achieved. It is shown in this case that an optimum capacitance value of the variable capacitance depends on the geometry of the DMS filter. In this case, the static capacitance of the individual transducers and, in particular, of the transducer connected in series with the variable capacitance is more important than the degree of cross-coupling, that is to say the capacitance of the transducer connected to the variable capacitance or generally to the concentrated element with adjacent transducers.

In one exemplary embodiment, an optimum variable capacitance has approximately the same capacitance value as the transducer connected to it. It therefore has ten times the capacitance value of individual cross-coupling formed by the transducer connected to the variable capacitance with an adjacent transducer. However, it is also possible to vary the filter geometry and in the process arrive at other optimum relationships between the capacitance value of the variable capacitance and, for example, the static capacitance of the transducer or the degree of cross-coupling.

It has also been found that a considerable part of the interfering cross-coupling to be compensated for with the invention is produced by terminal hot electrode fingers of transducers which couple to one another. Maximum undesirable cross-coupling is thus observed between those hot fingers of adjacent transducers which are at the shortest distance from one another. The undesirable cross-coupling can be additionally reduced by all measures which reduce the capacitive crosstalk between these closely adjacent hot electrode fingers of different transducers (=transducers of different types) or, in the case of symmetrical components, bring them more into line with one another, with the result that the filter is "symmetrized."

In one embodiment, the respective outermost electrode finger of each transducer, which faces the adjacent transducer of another type, is therefore connected to the ground connection. One or two electrode fingers connected to the ground connection between two hot electrode fingers having capacitive coupling to one another reduce this coupling further.

The transducers in the DMS track, the variable capacitance or generally the concentrated element and the common series resonator are preferably formed on a common piezoelectric substrate. In this case, the common series resonator and the variable capacitance, which is advantageously in the form of a variable resonator, may be formed directly adjacent to one another on the substrate, with the result that the two acoustic tracks of the series resonator and the variable resonator are parallel to one another. However, the concentrated element may also be in the form of a discrete component which is connected to the DMS track. However, it is also possible to integrate the concentrated element in a preferably multi-layer carrier substrate and to mount the chip with the DMS track on this carrier substrate. In addition, the carrier substrate may comprise further passive elements which may be integrated in the carrier substrate or may be mounted on the carrier substrate in the form of discrete components.

An advantageous trade-off between insertion loss and selectivity is achieved with a DMS filter having five transducers, three transducers of the first type acting as input transducers and two transducers of the second type acting as output transducers. The transducers of one type, which are present in an even number, are advantageously used for a symmetrical signal connection or are connected to a symmetrical port. The transducers of one type, which are present in an uneven number, may generally be connected only to an asymmetrical signal connection.

In addition to the at least one first transducer being connected to the concentrated element, for example the variable capacitance which may be a variable resonator, and to the common series resonator, series resonators may be additionally connected in series with the transducers. These are then arranged between one of the signal connections and a first branching node.

However, it is also possible to arrange an acoustic resonator in parallel with a signal connection.

Furthermore, it is possible to connect one or more ladder-type basic elements in series with the DMS filter, which basic elements each comprise a series resonator and a parallel resonator grounded in a parallel branch.

When connecting a plurality of ladder-type basic elements, directly adjacent parallel branches may be combined with a respective parallel resonator to form a common parallel branch with a correspondingly enlarged resonator. Two series resonators directly following one another in the ladder-type structure may likewise be combined to form a single series resonator which then has half the capacitance of the original series resonators.

BRIEF DESCRIPTION OF THE DRAWINGS

The invention is explained in more detail below using exemplary embodiments together with comparison tests and the associated figures. The figures are used only to illustrate the invention and are therefore only schematic and are not true to scale. For better illustration, size proportions may be distorted and individual parts may be illustrated on a larger or smaller scale. Identical or identically acting parts are denoted with the same reference symbols.

DETAILED DESCRIPTION OF ILLUSTRATIVE EMBODIMENTS

Figure 1:
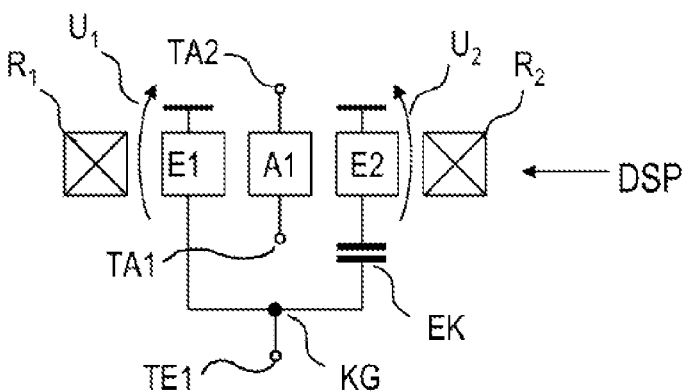
FIG. 1 shows a DMS filter having three transducers and a variable capacitance.

FIG. 1 shows a simple embodiment of the invention. The DMS filter has a DMS track DSP in which three transducers, two transducers E1, E2 of the first type and one transducer A1 of the second type, are arranged between two reflectors R1, R2. The two transducers of the first type E1, E2 are connected in parallel between a common node KG and a ground connection. The common node is directly connected to an asymmetrical signal connection TE1.

A variable capacitance is connected here, as a concentrated element EK, between the common node KG and one of the transducers of the first type (here the transducer E2). The voltage U1 applied to the transducer E1 thus differs from the voltage U2 applied to E2.

The connections TA1 and TA2 are connected to the transducer A1 of the second type arranged centrally in the DMS track DSP and together can form a symmetrical or an asymmetrical port. In the case mentioned last, one of the two signal connections is connected to ground.

Figure 2:
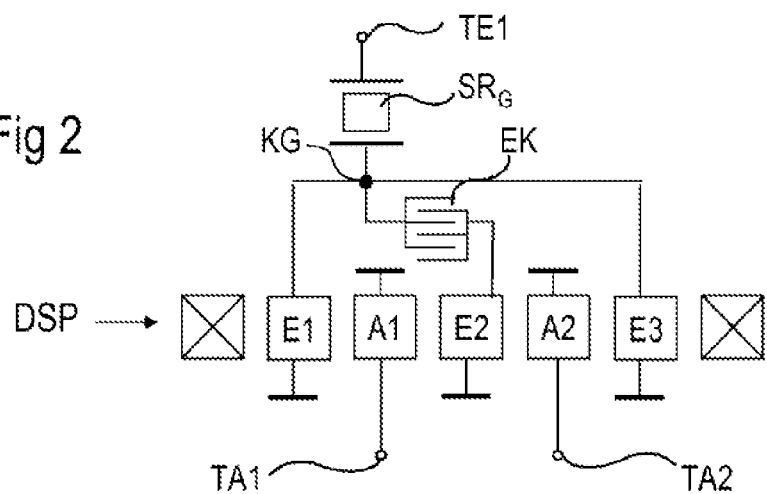
FIG. 2 shows a DMS filter having five transducers, a variable capacitance and a common series resonator.

FIG. 2 shows a somewhat more complex structure of a DMS filter according to the invention in which the DMS track DSP has a total of five transducers E, A which are arranged between two reflectors. Three transducers E1, E2, E3 of the first type are provided and are connected in parallel between a common node KG and ground. The two transducers A1, A2 of the second type are connected in parallel between the signal connections TA1, TA2 of the second port and ground. The signal connections TA1 and TA2 form a symmetrical port.

A variable capacitance which is in the form of an interdigital structure in this case is connected, as a concentrated element EK, between the middle transducer E2 of the first type and the common node KG. The orientation of the electrode fingers of this interdigital structure may be parallel to the propagation direction of the surface acoustic wave or transverse to the electrode fingers of the transducers in order to prevent the generation of interfering surface waves. Furthermore, the finger period of this interdigital structure may be selected to be larger, but preferably considerably smaller, than that of the transducers, with the result that no acoustic resonances are thus in the passband of the DMS filter and as few losses as possible also arise there.

As a further refinement, a common series resonator SRG is connected here in series between the signal connection TE1 of the first port and the common node KG. This resonator may be any desired resonator and may be formed from LC elements, for example. However, an acoustic resonator, that is to say a resonator which operates with acoustic waves, and, in particular, a technically identical surface acoustic wave resonator, for example an acoustic single-port resonator, are advantageously used. The port with the individual signal connection TE1 is an asymmetrical port, while the second port which is connected to the transducers of the second type can be operated in a symmetrical or asymmetrical manner.

Figure 3:
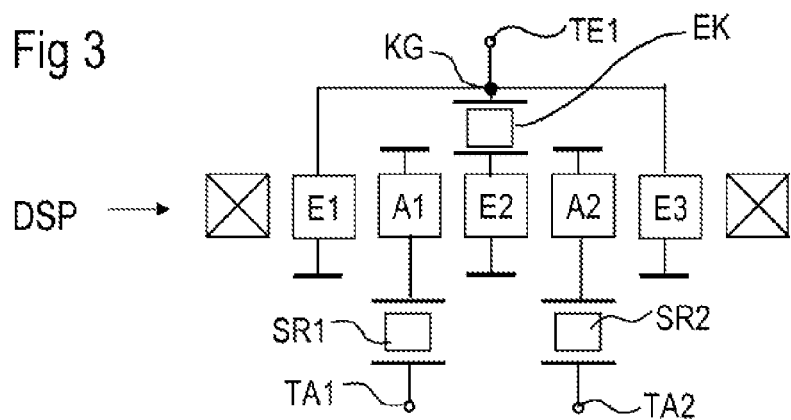
FIG. 3 shows a DMS filter having five transducers, a variable capacitance and two series resonators.

FIG. 3 shows a further refinement in which a total of five transducers E, A of the first and second types are arranged between two reflectors. A resonator a which acts like the variable capacitance from FIG. 1 is arranged here, as a concentrated element EK, between the middle transducer E2 of the first type and the common node KG. However, the concentrated element EK may also comprise a different element (see FIG. 13). The common node KG is connected to the signal connection TE1 of the first port. A respective series resonator SR1, SR2 is connected in series with the transducers A1, A2 of the second type and respectively connects these transducers to one of the signal connections TA1, TA2 of the second port. Whereas the variable capacitance CS acts as a voltage divider for a single transducer E2 of the first type, the two series resonators SR1, SR2 are used to further filter the RF signal transported between the first and second ports in order to obtain, in particular, a passband with a steeper edge.

Figure 4:
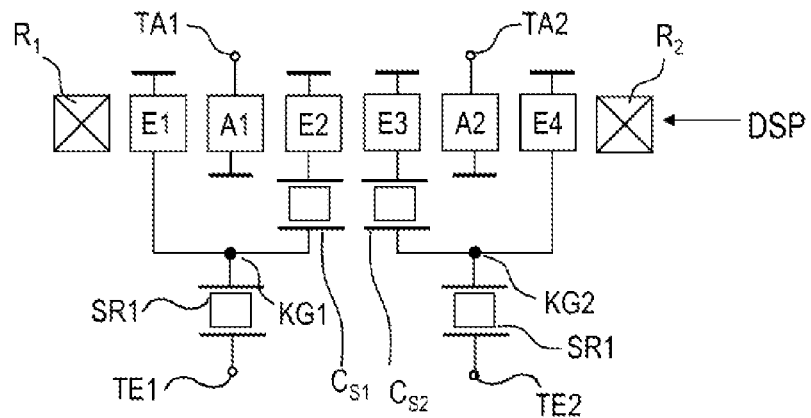
FIG. 4 shows a DMS filter having six transducers and two variable capacitances on the symmetrical side.

FIG. 4 shows a refinement of how the invention can be used in a filter which is operated in a symmetrical manner on both sides or in a balanced manner on both sides. A total of four transducers E1 to E4 of the first type are provided. Two of these four transducers are connected in parallel between a common first node KG1 and ground. A resonator is connected in series between a signal connection TE1 of the first port and the first common node KG1. The transducer A1 of the second type is arranged between the transducers E1, E2 and is connected between a signal connection and ground. In this respect, this partial structure corresponds to a 3-transducer DMS filter as illustrated in FIG. 1 without the second reflector but with a series resonator.

Three transducers E3, A2 and E4 are again arranged symmetrically thereto in the DMS track DSP, the two transducers E3, E4 of the first type being connected in parallel between a second common node KG2 and ground. In this case too, a series resonator SR2 is connected between the second common node and the signal connection TE2 of the first port. A variable capacitance CS1, CS2 in the form of a resonator is connected between the respective common node KG1 and one of the respective two transducers of the first type which are connected in parallel.

The two transducers A1, A2 of the second type are connected to the signal connections TA1, TA2 of the second port. As a result of the fact that each of the two parallel symmetrical signal paths has such a variable capacitance CS, symmetrical signal routing is possible for both ports. However, it is also possible to operate one of these ports in an asymmetrical manner.

Figure 8:
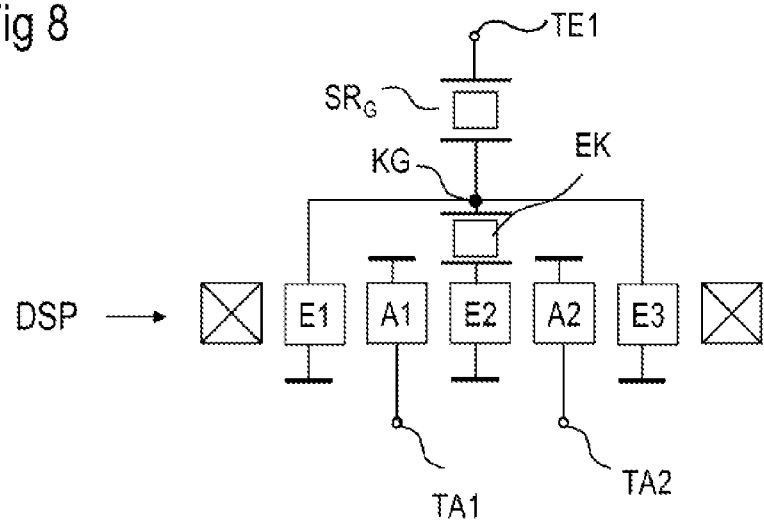
FIG. 8 shows a DMS filter having five transducers, a variable capacitance and a common series resonator.

FIG. 8 shows a preferred embodiment of a DMS filter in which five transducers are arranged between two reflectors in the DMS track DSP. The transducers E1, E2, E3 of the first type which are connected to a first connection TE1 are connected in parallel between a common node and ground. A concentrated element EK (variable capacitance) in the form of a resonator is connected between the middle transducer E2 of the first type and the common node KG. A common series resonator SRG which is in the form of a single-port resonator, for example, is connected between the first signal connection TE1 and the common node KG. Overall, two transducers of the second type are provided in an alternating manner with respect to the transducers of the first type and are connected to the two signal connections TA1, TA2 of the second port which may be operated in a symmetrical manner, for example.

Figure 5:
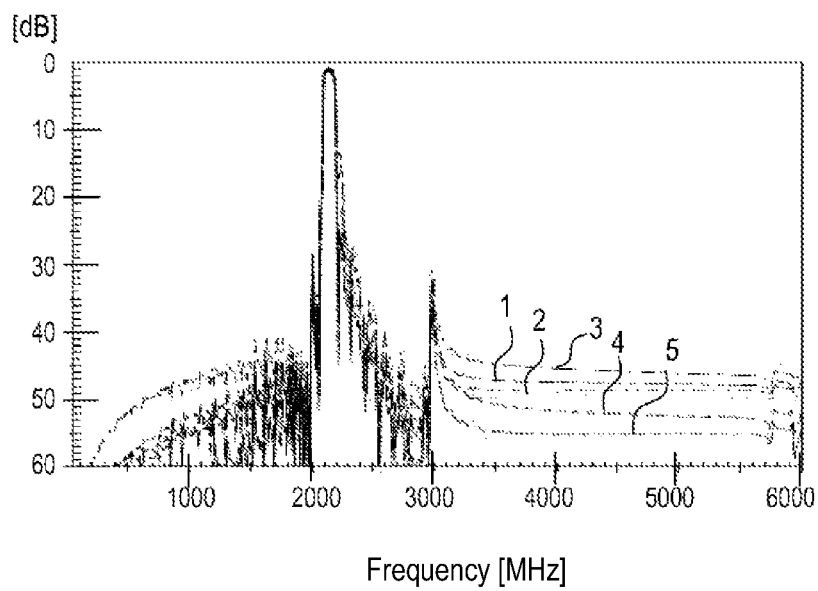
FIG. 5 shows simulated transmission curves of a DMS filter according to the invention and of different comparison filters without a variable capacitance.

FIG. 5 shows the transmission curve of the DMS filter illustrated in FIG. 8 in comparison with the transmission curves of four comparison structures, the first three of which are each a DMS filter without the variable capacitance according to the invention. The scattering parameter S21 determined in a simulation is illustrated in each case.

Curve 1 is determined for a DMS filter comprising five transducers, in which three transducers of the first type are connected to a common node. Two transducers of the second type are arranged in an alternating manner thereto. Two series resonators are connected in parallel between the common node and the corresponding signal connection. No variable resonator is provided.

Curve 2 is illustrated for a DMS filter which likewise comprises five transducers and in which a common series resonator is provided between the signal connection and the common node.

Curve 3 is determined for a DMS filter which comprises five transducers and in which the three transducers of the first type are directly connected to a signal connection. Neither a series resonator nor a variable capacitance is provided.

Curve 4 is determined for a DMS filter according to the invention comprising five transducers, in which a variable capacitance in the form of a resonator is connected between the middle transducer of the first type and the common node. In this case, a value of 0.9 pF was assumed in each case for the capacitance C0 of the middle transducer and the variable capacitance.

Curve 5 from FIG. 5 shows the transmission curve for a DMS filter according to FIG. 8. It is shown that the attenuation in the upper stop band (fly-back) is considerably improved with the variable capacitance according to the invention (see curves 4 and 5) in comparison with the three comparison filters with curves 1 to 3. The greater improvement is achieved if, in addition to the variable capacitance, a common series resonator is also provided (see curve 5 from FIG. 5). In this case too, a value of 0.9 pF was assumed in each case for the capacitance C0 of the middle transducer E2 and the variable capacitance CS (or for the capacitance C0 of the resonator used as the variable capacitance CS).

Figure 6:
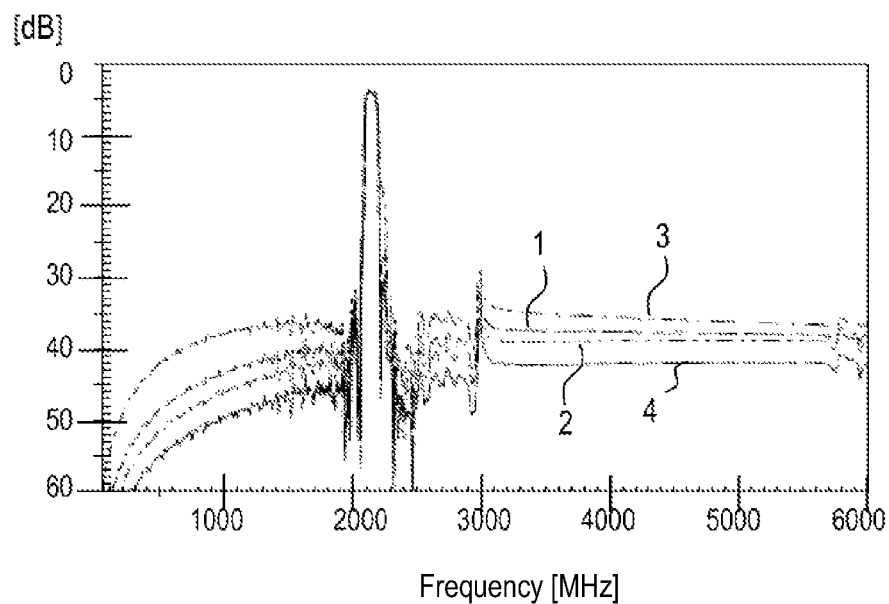
FIG. 6 shows the transmission curve of a DMS filter according to the invention, measured at an individual connection.

FIG. 6 shows a number of simulated transmission curves 1 to 4 which, in contrast to the transmission curves from FIG. 5, were determined for a single signal connection of the second port. The second signal connection is connected to ground via a 50-Ω resistor. In this case, curves 1 to 3 correspond to comparison tests 1 to 3 from FIG. 5, while curve 4 was determined for a DMS filter according to FIG. 8.

In comparison with curves 1 to 3, transmission curve 4 shows that the variable capacitance according to the invention not only has an advantageous effect on a symmetrical port, but also gives rise to an improvement in the fly-back range for a port which is operated on one side or in an asymmetrical manner (here the port connected to the transducers of the second type).

Figure 7:
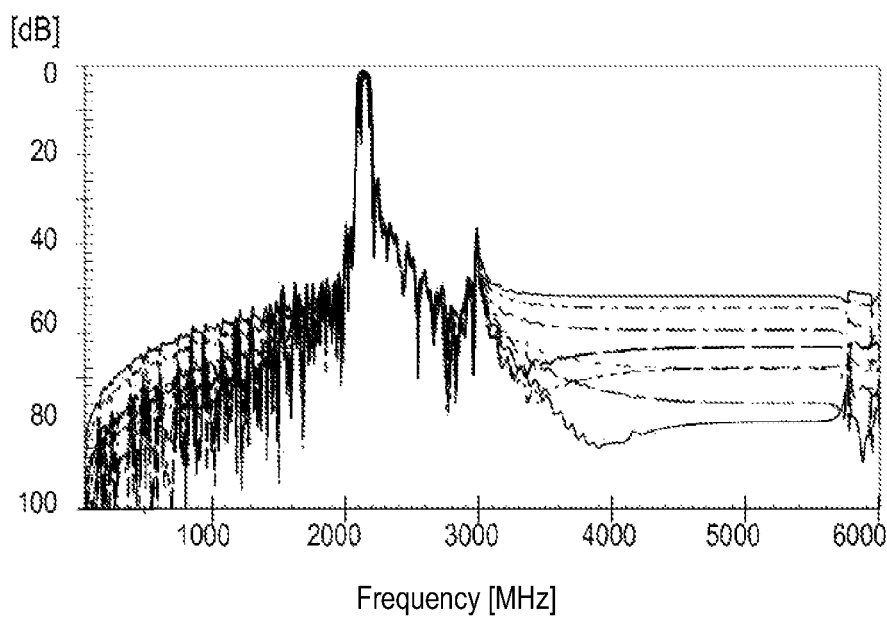
FIG. 7 shows different transmission curves for a DMS filter with different variable capacitances.
Figure 9:
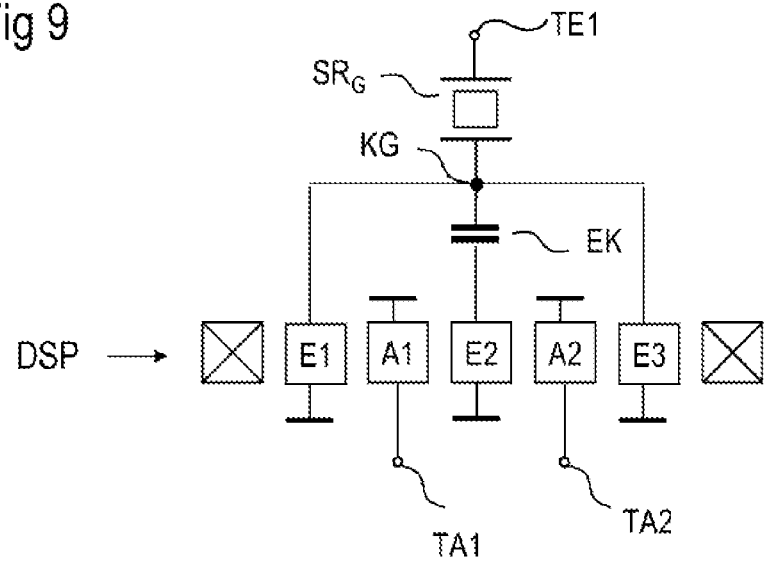
FIG. 9 shows a DMS filter like in FIG. 8, in which the variable capacitance is in the form of a pure capacitance.

FIG. 9 shows a DMS filter in which, in contrast to the DMS filter according to FIG. 8, the concentrated element EK is in the form of a pure capacitance. If different capacitance values are now used in a simulation calculation for this variable capacitance, the transmission curves illustrated in FIG. 7 are obtained (the scattering parameter S21 is illustrated in each case).

It is shown that the achievable attenuation in the fly-back range substantially depends on the capacitance value of the variable capacitance CS. The variable capacitance was varied between 0.01 and 1.7 pF in the different tests. With a particular capacitance value (0.1 pF in the selected comparison structure), an optimum with regard to improved selectivity in the fly-back range is shown. However, the selectivity is also improved in comparison with a known DMS filter even with a non-optimum capacitance value of the variable capacitance. This also proves that the improvement according to the invention operates independently of the acoustics and is solely an electrical or capacitive effect.

Figure 10:
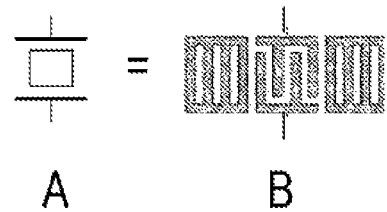
FIG. 10 shows a resonator which can be used as a variable capacitance, FIGS. 11A-11D, collectively

FIG. 10 shows a possible electrode structure for a single-port resonator which can be used as a variable capacitance. FIG. 10A shows the circuit symbol used in the figures, while FIG. 10B shows a simplified illustration of a metallization for an acoustic single-port resonator. A real single-port resonator has a larger number of both electrode fingers in the transducer and reflector strips in the reflector.

Figure 11:
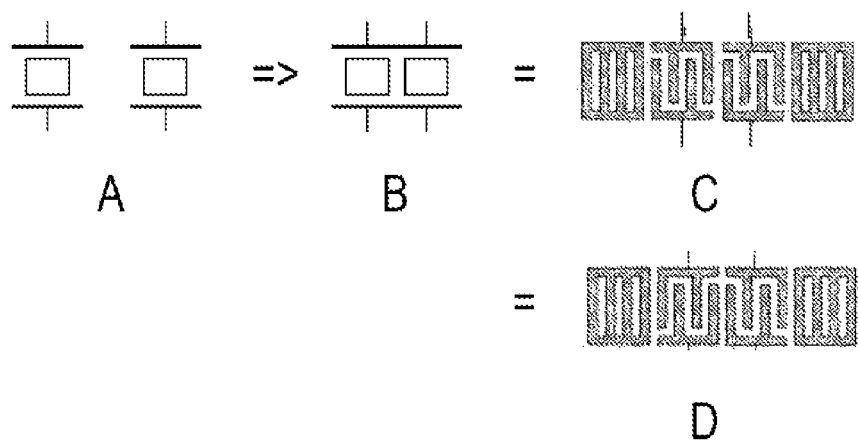
FIG. 11, show the combination of two parallel resonators to form a common resonator.

FIG. 11 shows a possible way in which two resonators connected in parallel, as in FIG. 11A, can be combined in a common structure in the form of a two-port resonator as in FIG. 11C or 11D. FIG. 11B shows a possible illustration in simplified notation. Such a two-port resonator (FIG. 11D) could be used in a filter according to FIG. 3 for the two series resonators SR1, SR2 connected to the second port. In the exemplary embodiment according to FIG. 12, the two-port resonator (from FIG. 11C) could be used for the two concentrated elements EK1 and EK2 in the form of series resonators or could replace the latter. In addition, a two-port resonator according to FIG. 11D can replace the two series resonators SR1 and SR2 which are connected in series with the two signal connections TE1, TE2 of the second port in FIG. 4. A two-port resonator according to FIG. 11D may replace, in particular, two resonators in symmetrical signal paths which are parallel to one another. A two-port resonator according to FIG. 11C may replace, in particular, two resonators or two concentrated elements in signal paths which are parallel to one another but are asymmetrical.

In further simulation calculations, an attempt was made to estimate the influence of the parallel capacitances between the transducers arranged in the DMS track and to find out where the largest parallel capacitances are and which of the different parallel capacitances have the greatest influence on the transmission behavior.

In a DMS filter having a total of five transducers, these are the four parallel capacitances between directly adjoining transducers, the value of each of which is in the range between 0.01 and 0.05 pF. The effects of these parallel capacitances may be reduced with variable capacitances according to the invention, the magnitude of which is in the range of 10 times to 20 times this capacitance value.

Figure 12:
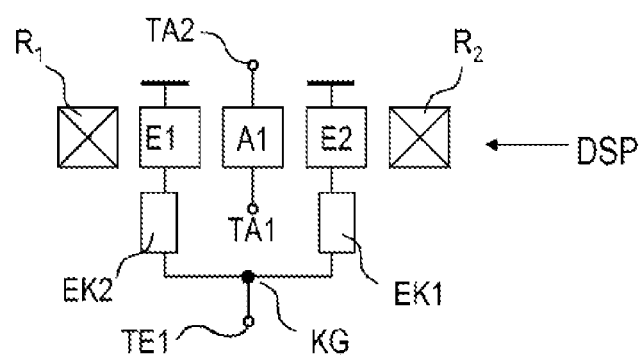
FIG. 12 shows a DMS filter having three transducers and two concentrated elements which are connected to two first transducers.

FIG. 12 shows a DMS filter having three transducers E1, A1, E2, in which a concentrated element EK1, EK2 is respectively connected between the two first transducers E1, E2 and the common node KG. The two concentrated elements EK1, EK2 are preferably different, with the result that the two first transducers see a different impedance and different power transmission to the transducers thus takes place.

Figure 13:
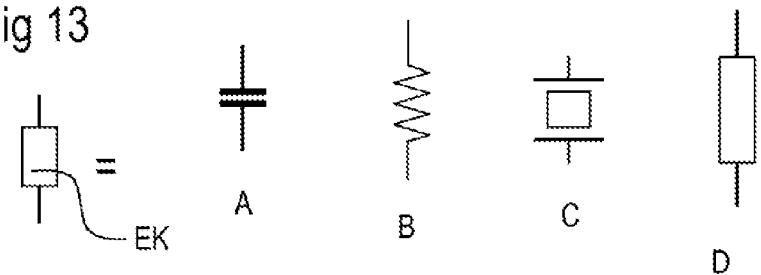
FIG. 13 shows different possible ways of implementing a concentrated element.

FIG. 13 shows different possible ways of implementing a concentrated element EK. The latter may be in the form of A) a capacitance, B) an inductance or coil, C) a resonator or D) a resistor. A concentrated element may also be implemented as a combination of different elements of the concentrated elements illustrated in FIGS. 13A to 13D.

Figure 14:
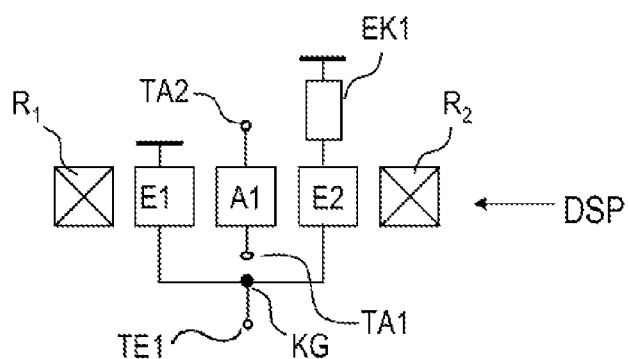
FIG. 14 shows a DMS filter having three transducers and a concentrated element which is connected between a first transducer and the reference potential.

FIG. 14 shows a DMS filter having three transducers E1, A1, E2 and a concentrated element EK which is connected between a first transducer E2 and the reference potential. This connection has the same effect as a connection of the concentrated element between the first transducer E2 and the common node KG and results in improved selectivity of the filter in comparison with a pure DMS filter with a DMS track without concentrated elements or other series or parallel elements.

Figure 15:
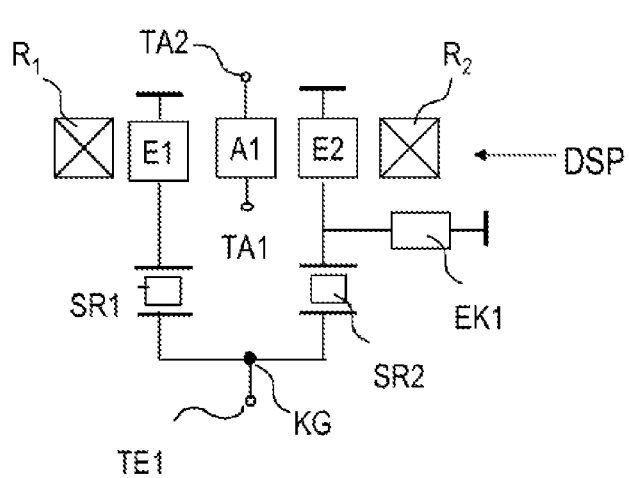
FIG. 15 shows a DMS filter having three transducers and a concentrated element which is connected in a parallel branch between a first transducer and the common node.

FIG. 15 shows a DMS filter having three transducers E1, A1, E2 and a concentrated element which is connected in a parallel branch between one of the first transducers E2 and the common node KG. Since a parallel element directly connected to the common node would act in the same manner on both first transducers connected to the common node KG, at least one series element, here a series resonator SR2, is connected between the parallel branch and the common node in order to differentiate the two first transducers E1, E2 which are connected in parallel. Since the differentiation is intended to be effected solely by the concentrated element EK1 in the parallel branch, a second series resonator SR1 is connected between the other first transducer E1 and the common node KG for reasons of symmetry.

Figure 16:
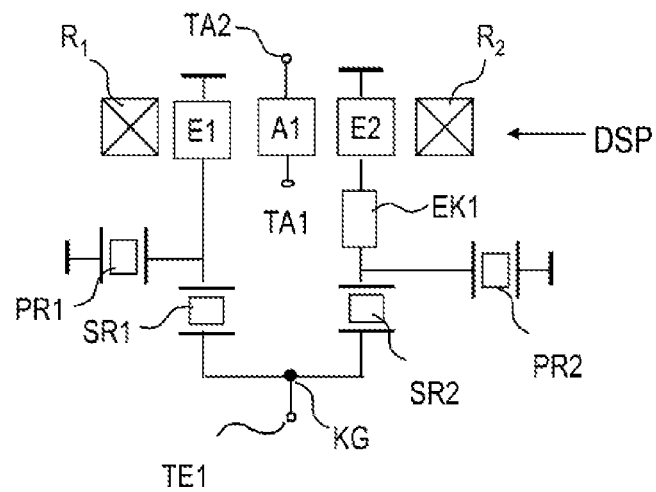
FIG. 16 shows a DMS filter having three transducers in series with two ladder-type basic elements and a concentrated element which is connected between a first transducer and the common node.

FIG. 16 shows a DMS filter having three transducers E1, A1, E2. The transducers of the first type (first transducers E1, E2) are each connected in series with a ladder-type basic element which respectively comprises a series resonator SR1, SR2 and a parallel resonator PR1, PR2. A concentrated element EK1 is connected in series between the series resonator SR2 and the first transducer E2.

Figure 17:
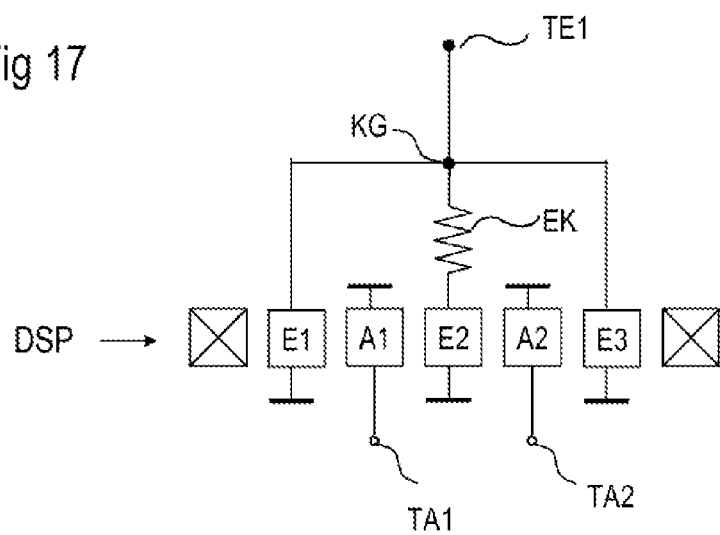
FIG. 17 shows a DMS filter having five transducers and a concentrated element which is in the form of a coil and is connected between a middle transducer of the first transducers and the common node.

FIG. 17 shows a DMS filter having five transducers E1, A1, E2, A2, E3 and a concentrated element EK which is in the form of a coil and is connected between a middle transducer E2 of the transducers of the first type and the common node KG. The coil may be connected, as a discrete component, to the DMS track DSP. However, the coil may also be integrated together with the metallization of the DMS track DSP on the surface of the piezoelectric substrate of the DMS track. It is also possible to integrate the coil in the form of correspondingly structured conductor sections in a multi-layer carrier substrate which carries the piezoelectric substrate or on which the chip with the DMS track DSP is mounted.

The invention is not restricted to providing precisely one concentrated element and, in particular, precisely one variable capacitance for each transducer type. For an appropriate number of transducers of the first type, it is also possible to provide a larger number of concentrated elements or variable capacitances, but at least one of the transducers of the first type must always be connected in a different manner, that is to say must be connected to another concentrated element or, for example, directly to the common node or the reference potential.

It is accordingly also possible to apply the invention to DMS filters having a number of transducers which differs from the exemplary embodiments. A DMS filter according to the invention has at least three transducers since at least two transducers solely of the first type must be provided. There is no upper limit on the number of transducers. However, it should be taken into consideration in this case that, with a very large number of transducers within the DMS track, the acoustic losses of the DMS filter increase and their number is therefore naturally limited.

It is also possible to connect a DMS filter according to the invention in parallel or in series with one or more similar or different DMS tracks in order to improve the selectivity. However, in this case too, the losses increase with increasing number of DMS tracks or transducers. The same applies to the series connection to further series resonators or to ladder-type basic elements.

Therefore, the invention is also not restricted to the exemplary embodiments illustrated but rather only to filters having the combination of features in the main claim. This also means that all concentrated elements specifically specified or used in the exemplary embodiments can be replaced with other concentrated elements in the stated selection.

The invention claimed is:

1. A DMS filter comprising:
   first and second transducers of a first type, each coupled in series between a common node and a reference potential;
   a transducer of a second type, the first and second transducers of the first type and the transducer of the second type being arranged in a DMS track and being selected from input transducers and output transducers; and
   a first concentrated element, wherein the first transducer of the first type is coupled to the first concentrated element, the first concentrated element being arranged between the common node and the first transducer or between the first transducer and the reference potential, whereby voltages applied to the first and second transducers of the first type differ,
   wherein the common node is connected to an asymmetrical signal connection.

2. The DMS filter according claim 1, wherein all transducers of the first or second type are connected in series with a common series resonator.

3. The DMS filter according to claim 2, wherein the first and second transducers of the first type are the input transducers and the common node is coupled to a signal connection of the input, and wherein the common series resonator is arranged between the signal connection of the input and the common node or between the transducers of the first type and the reference potential.

4. The DMS filter according to claim 2, wherein the first and second transducers of the first type are the output transducers and the common node is coupled to a signal connection of the output, and wherein the common series resonator is arranged between a signal connection of the input and the input transducer.

5. The DMS filter according to claim 2, wherein the transducers in the DMS track, the first concentrated element and the common series resonator are formed on a common piezoelectric substrate.

6. The DMS filter according to claim 1, wherein the second transducer of the first type is coupled to a second concentrated element that is arranged between the second transducer and the common node or between the second transducer and the reference potential, the first and second concentrated elements differing from one another.

7. The DMS filter according to claim 1, wherein the first concentrated element comprises an element selected from the group consisting of a capacitance, an inductance, an acoustic resonator and a resistor.

8. The DMS filter according to claim 1, wherein the first concentrated element is arranged, as a series element, in a signal path that runs between the common node and the reference potential connected to the respective transducer of the first type.

9. The DMS filter according to claim 1, wherein the first concentrated element is arranged in a parallel path, the parallel path branching off from a signal path of the first transducer of the first type.

10. The DMS filter according to claim 1, further comprising a third transducer of the first type, the first, second and third transducers being provided in the DMS track and wherein the first concentrated element is coupled between the common node and a middle transducer of the first, second and third transducers.

11. The DMS filter according to claim 1,
    wherein a signal connection coupled to the common node is part of a symmetrical port;
    wherein a second signal connection of the symmetrical port is connected to a second common node that is coupled in series with two further transducers of the first type in a manner symmetrical with a first common node; and
    wherein a first transducer of the two further transducers is connected to a further concentrated element in such a manner that the voltages applied to the first and second transducers of the further transducers are different.

12. The DMS filter according to claim 1, wherein, between two respective directly adjacent transducers of different types, a respective outermost electrode finger of each of the two transducers that faces the adjacent transducer is connected to the reference potential.

13. The DMS filter according to claim 1, further comprising:
    a third transducer of the first type, where in the first, second and third transducers of the first type are configured as the input transducers; and
    a second transducer of the second type, wherein the transducer and second transducer of the second type are configured as output transducers.

14. The DMS filter according to claim 1, further comprising an additional common series resonator coupled in series with the transducers and arranged between a signal connection and a first branching node.

15. A DMS filter comprising:
    first and second transducers of a first type, each coupled in series between a common node and a reference potential;
    a transducer of a second type, the first and second transducers of the first type and the transducer of the second type being arranged in a DMS track and being selected from input transducers and output transducers; and
    a concentrated element, wherein the first transducer of the first type is coupled to the concentrated element, the concentrated element being arranged between the common node and the first transducer or between the first transducer and the reference potential, whereby voltages applied to the first and second transducers of the first type differ,
    wherein the DMS filter comprises a symmetrical port having two connections which are symmetrical to one another, and
    wherein the common node is connected to exactly one of the two connections of the symmetrical port.

* * * * *